(12) United States Patent
Mari Curbelo et al.

(10) Patent No.: US 12,046,584 B2
(45) Date of Patent: *Jul. 23, 2024

(54) SEMICONDUCTOR MODULE

(71) Applicant: Danfoss Silicon Power GmbH, Flensburg (DE)

(72) Inventors: Alvaro Jorge Mari Curbelo, Oberschleissheim (DE); Tobias Schuetz, Flensburg (DE); Robert Roesner, Oberschleissheim (DE)

(73) Assignee: DANFOSS SILICON POWER GMBH, Flensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/861,217

(22) Filed: Jul. 10, 2022

(65) Prior Publication Data

US 2022/0344310 A1 Oct. 27, 2022

Related U.S. Application Data

(62) Division of application No. 15/931,703, filed on May 14, 2020, now Pat. No. 11,532,600.

(30) Foreign Application Priority Data

May 16, 2019 (DE) .......................... 102019112935.4

(51) Int. Cl.
*H01L 23/538* (2006.01)
*H01L 23/00* (2006.01)
(Continued)

(52) U.S. Cl.
CPC ...... *H01L 25/072* (2013.01); *H01L 23/49811* (2013.01); *H01L 23/5386* (2013.01); *H01L 24/49* (2013.01); *H01L 2224/49175* (2013.01)

(58) Field of Classification Search
CPC ............. H01L 25/072; H01L 23/49811; H01L 23/5386; H01L 23/49541
See application file for complete search history.

(56) References Cited

U.S. PATENT DOCUMENTS 5,539,232 A   7/1996  Nakanishi et al.
11,532,600 B2 * 12/2022 Mari Curbelo ... H01L 23/49844
(Continued)

OTHER PUBLICATIONS

Zhu, N., et al, "Substrate Layout Evaluation for T-type Three-level IGBT Modules", IEEE (2014), pp. 4677-4684 (Year: 2014).

*Primary Examiner* — Michele Fan
(74) *Attorney, Agent, or Firm* — McCormick, Paulding & Huber PLLC

(57) ABSTRACT

A half bridge power module (1) comprising a substrate (2) comprising an inner load track (11), two intermediate load tracks (12, 14) and two outer load tracks (10,13), wherein an external terminal is mounted on one of the intermediate load tracks (12, 14), an external terminal (3, 4) is mounted on one of the outer load tracks (10, 13) and an external terminal (5) is mounted on the inner load track (11); wherein semiconductor switches (101, 12, 105, 106) are mounted on the outer load tracks (10, 13) and are electrically connected to the intermediate load track (12); and semiconductor switches (103, 104, 107, 108) are mounted on the intermediate load tracks (12, 14) and are electrically connected to the inner load track (11).

20 Claims, 4 Drawing Sheets

(51) Int. Cl.
*H01L 23/498* (2006.01)
*H01L 25/07* (2006.01)

(56) References Cited

U.S. PATENT DOCUMENTS

| | | |
|---|---|---|
| 2016/0172995 A1 | 6/2016 | Obiraki et al. |
| 2017/0338162 A1 | 11/2017 | Cottet et al. |
| 2019/0140557 A1 | 5/2019 | Zhang et al. |
| 2019/0304946 A1* | 10/2019 | Cottet ............... H01L 23/49811 |

* cited by examiner

SEMICONDUCTOR MODULE

CROSS-REFERENCE TO RELATED APPLICATION

This application is a Divisional Application of U.S. patent application Ser. No. 15/931,703, filed on May 14, 2020, and claims foreign priority benefits under 35 U.S.C. § 119 to German Patent Application No. 102019112935.4 filed on May 16, 2019, each of which is hereby incorporated by reference in its entirety.

TECHNICAL FIELD

Semiconductor power modules are widely used in industry. For example, such a power module may be used for the controlled switching of high currents and can be used in power converters (such as inverters) to convert DC to AC or vice versa, or for converting between different voltages or frequencies of AC. Such inverters are used in motor controllers or interfaces between power generation or storage, or a power distribution grid.

The semiconductor power module is designed to fulfill two major characteristics: High power conversion efficiency and high power density. Factors as lifetime, cost and quality are also taken into account. In order to achieve high power density, high performance wide-bandgap semiconductors, such as Silicon Carbide (SiC) semiconductor switches may be used, as they generally outperform standard silicon based semiconductor switches, i.e. Insulated Gate Bipolar Transistors (IGBT). SiC devices put high demands on the design of the power module from thermal and electrical standpoint. The wide-bandgap semiconductors (e.g., SiC semiconductor switches) have the characteristic that they switch very fast, meaning that the transition from conduction to blocking mode takes only a few nanoseconds.

Fast switching in electronic circuits, in combination with stray inductances, causes voltage overshoots when such semiconductor power modules are use. These voltage overshoots increase switching losses, and may cause EMI emissions through ringing. As current gradients during switching are high, the stray/parasitic inductance of the whole assembly needs to be as small as possible.

SiC MOSFETs are used as the semiconductor switches in applications where highest efficiency in small building volume is required by the application. SiC MOSFETs show fast switching speeds and low on-state resistance at the same time. Since SiC wafers are expensive to manufacture, and with current manufacturing processes it is hard to fabricate components with an acceptably low crystal failure amount, the die are typically very small (for example, 5-25 mm$^2$). This keeps yield losses low, but restricts the total current that a SiC semiconductor switches can pass. In order to achieve high output powers, several of these small semiconductor switches (for example MOSFETs) need to be operated in parallel. In applications such as automotive power conversion, the use of multiple semiconductor switches in parallel takes up space within the semiconductor power module, yielding potentially larger modules. However, space is at a premium within a vehicle, and increasing the size of modules is not generally an option. It is therefore a great advantage if innovative design of layouts can both accommodate multiple semiconductor switches in parallel, a balanced (symmetric) operation, low stray inductance and small overall layout size.

SUMMARY

It is, thus, an object of the present invention to provide a power module which is capable of exhibiting the simultaneous switching and balanced operation of multiple semiconductor switches in parallel, lower stray inductances, and more stable and efficient operation than currently available power modules.

According to a first aspect of the present invention the above and other objects are fulfilled by providing a power module providing a half bridge, the power module comprising: at least one substrate comprising an inner load track, two intermediate load tracks and two outer load tracks, where the inner load track is elongated and may extend substantially across the at least one substrate in a first direction; wherein an external terminal is mounted on at least one of the intermediate load tracks at one end of the power module in the first direction; wherein an external terminal is mounted on at least one of the outer load tracks and an external terminal is mounted on the inner load track; wherein the external terminals are mounted at the other end of the power module to the external terminal mounted on at least one of the intermediate load tracks in the first direction; wherein semiconductor switches are mounted on the outer load tracks and are electrically connected to the intermediate load track; and wherein semiconductor switches are mounted on the intermediate load tracks and are electrically connected to the inner load track.

The substrate may comprise an insulating base, with conducting tracks to form the circuitry required attached to the insulating base. A suitable substrate may be a DBC (direct bonded copper) substrate formed of two conducting copper layers either side of an insulating ceramic layer. Other suitable substrates may include DBA (direct bonded aluminum) or other substrates well known in the field.

The term "track" is here used to specify a circuit track formed from a metal layer forming part of the substrate and insulated from other tracks by a gap. The term "load track" is here used to specify a track suitable for carrying a large current, such as that supplying the electrical load for which the power module is supplying power. Suitability for large currents may be a combination of the width of the track and thickness of the track, forming a large cross-sectional area and thus allowing the passage of large currents without undue heating.

The term "semiconductor switches" is here used to include any of a number of known semiconductor switching devices. Examples of such devices are Thyristors, JFETs, IGBTs and MOSFETs, and they may be based on traditional silicon technology or wide band-gap technologies such as silicon carbide (SiC).

The term "mounted" is here used to mean the permanent connection of a device to a track, and may include an electrically conducting connection. Means of such connections include soldering, brazing and sintering.

The term "electrically connected to" is here used to mean the connection of part of the device to a remote track or other device. Traditionally this form of connections made using metallic wirebonds comprising aluminum. However, other metals such as copper may be usable. The term also covers the use of ribbon or tape bonds, braided tapes and the use of solid metal structures such as clips or busbars.

The layout of the load tracks may be symmetric about a line extending in the first direction.

In one embodiment of the inventive power module, each intermediate load track may comprises a first elongated arm extending in the first direction between the outer load track and the inner load track with respect to a second direction at right angles to the first direction, and a second elongated arm extending in the first direction between the outer load track and the edge of the substrate with respect to the second direction wherein at least one semiconductor switch may be mounted on an outer load track and electrically connected to a second elongated arm of one of the intermediate load tracks.

In addition or alternatively, the inner load track may comprise a third elongated arm extending in the first direction between the first intermediate load track and the edge of the substrate with respect to the second direction, and a fourth elongated arm extending in the first direction between the second intermediate load track and the edge of the substrate with respect to the second direction, wherein at least one semiconductor switch may be mounted on an intermediate load track and electrically connected to an elongated arm of the inner load track.

In a particularly preferred embodiment, the power module may comprise a gate contact pad which is positioned centrally in a group of semiconductor switches and wherein gate connections may extend radially from the gate contact pad to the semiconductor switches.

In another preferred embodiment, an external gate contact terminal may be placed on the external surface of the power module and extend substantially orthogonally to the plane of the substrate.

BRIEF DESCRIPTION OF THE DRAWINGS

The invention will become more fully understood from the detailed description given herein below. The accompanying drawings are given by way of illustration only, and thus, they are not limitative of the present invention. In the accompanying drawings.

DETAILED DESCRIPTION

Figure 1:
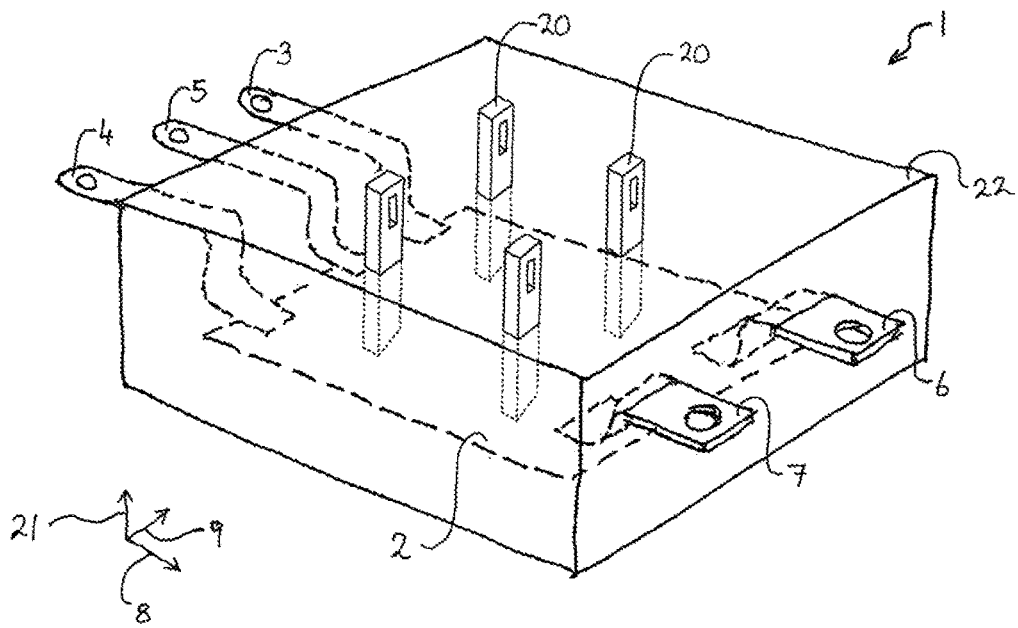
FIG. 1 shows a perspective view of a first embodiment of the inventive power module.

Referring now in detail to the drawings for the purpose of illustrating preferred embodiments of the present invention, a first embodiment of the inventive power module 1 is shown in FIG. 1. The power module 1 shown comprises a substrate 2 within the body of the power module. The power module 1 is designed to provide a half bridge circuit, and to this end three DC power terminals are provided 3, 4, 5 and two AC power terminals 6, 7 at the opposite end of the packaging. The substrate 2, and circuitry connected to it, together with the internal sections of the power terminals 3, 4, 5, 6, 7 are, in this embodiment, encapsulated in a mold compound 22. Alternative embodiments are possible where the substrate is attached to a baseplate and/or mounted within a frame which is subsequently filled with silicone gel and completed with a lid. In addition, it is also possible to mount several substrates within a single package to provide a power module containing several half bridges.

Figure 2:
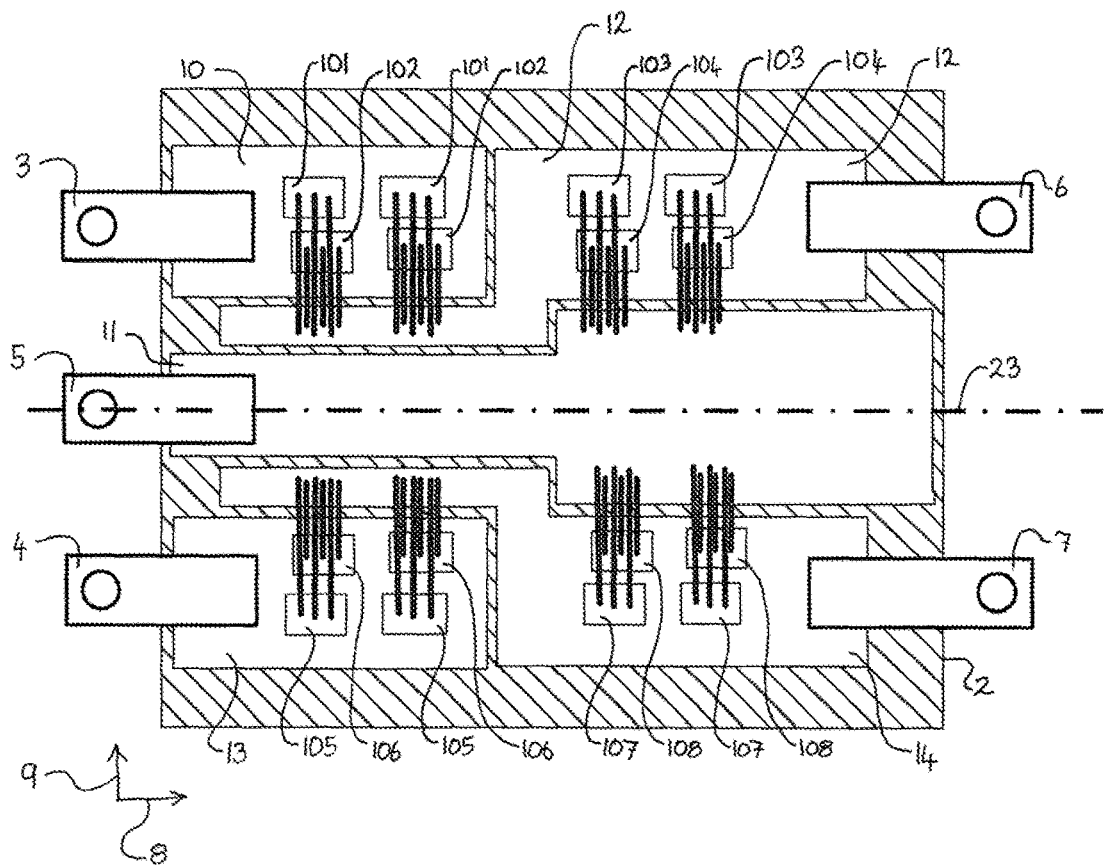
FIG. 2 shows a plan view of an embodiment of the substrate 2 which forms part of the power module 1 shown in FIG. 1.

FIG. 2 shows an embodiment of the substrate 2 which forms part of the power module 1 shown in FIG. 1. The substrate may be, for example, a DCB (direct copper bonded) substrate comprising a central ceramic layer acting as an insulator, and clad on both sides with a copper layer. In some embodiments the lower copper layer is left complete, whilst the upper copper layer is etched to form a number of separate conducting tracks which form the required circuits. Onto the tracks are mounted components such as semiconductor switches.

In the embodiment shown in FIG. 2 there an inner load track 11, two intermediate load tracks 12, 14 and two outer load tracks 10,13. The inner load track 11 is elongated and extends substantially across the substrate 2 in a first direction 8. AC terminals terminal 6, 7 are mounted on the intermediate load tracks 12, 14 at one end of the power module in the first direction 8. DC terminals 3, 4, 5 are mounted on the outer load tracks 10, 13 and the inner load track 11. The DC terminals 3, 4, 5 are mounted at the other end of the power module to the AC terminals 6, 7. Semiconductor switches 101, 102, 105, 106 are mounted on the outer load tracks 10, 13 and are electrically connected to the intermediate load track 12 by means of wirebonds and semiconductor switches 103, 104, 107, 108 are mounted on the intermediate load tracks 12, 14 and are electrically connected to the inner load track 11 by means of wirebonds. In this embodiment the semiconductor switches comprise SiC (silicon carbide) MOSFETs. The use of other types of semiconductor switches is also possible, for example IGBTs. Each set of semiconductor switches described above may consist of more than two semiconductor chips.

The embodiment shown in FIG. 2 is symmetric about a line 23 extending in the first direction 8.

Figure 3:
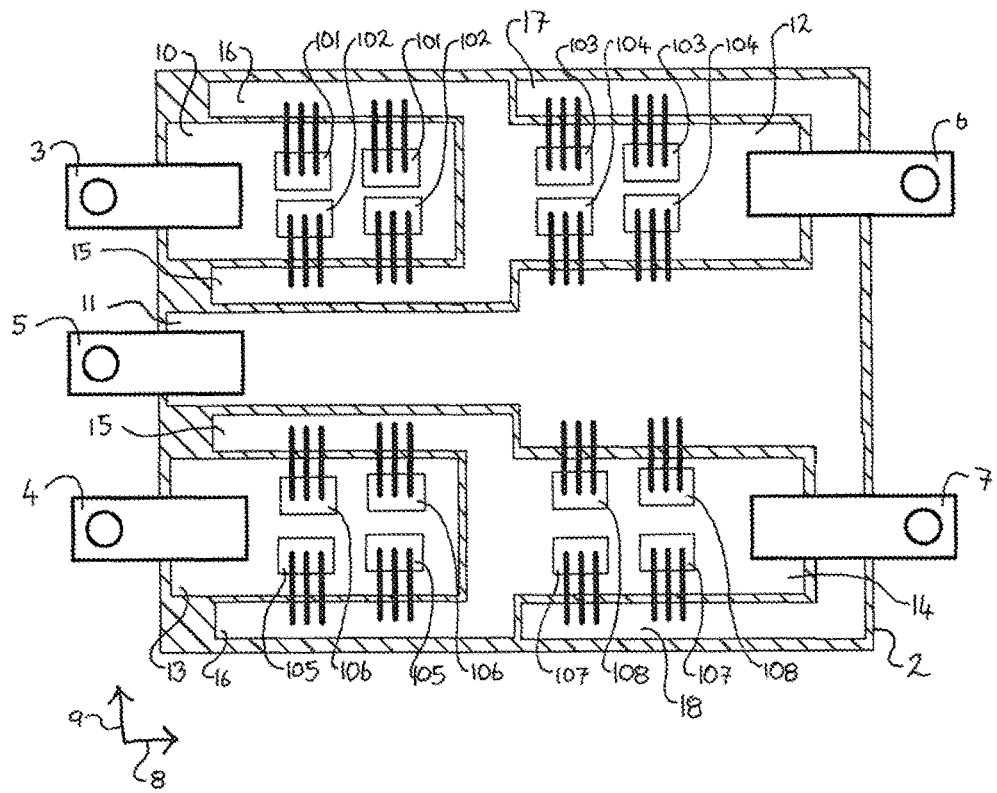
FIG. 3 shows a plan view of an alternative embodiment of the substrate 2 which forms part of the power module 1 shown in FIG. 1.

FIG. 3 illustrates an alternative embodiment of the substrate 2 which forms part of the power module 1 shown in FIG. 1;

The significant difference between these two embodiments is that the intermediate load tracks 12, 14 here comprise extended arms that partially surround the outer load tracks 10, 13, and allow the semiconductor switches mounted on the outer load tracks and alternative route for the wirebonds that connecting to the intermediate load tracks. Each intermediate load track 12, 14 comprises a first elongated arm 15 extending in the first direction 8 between the outer load track 10, 13 and the inner load track 11 with respect to a second direction 9 at right angles to the first direction 8, and a second elongated arm 16 extending in the first direction 8 between the outer load track 10, 13 and the edge of the substrate 2 with respect to the second direction 9. In addition, the inner load track 11 comprises a third elongated arm 17 extending in the first direction 8 between the first intermediate load track 12 and the edge of the substrate 2 with respect to the second direction 9 and a fourth elongated arm 18 extending in the first direction 8 between the second intermediate load track 14 and the edge of the substrate 2 with respect to the second direction 9. These arms extending from the inner load track allow the semiconductor switches 101, 105, which are mounted on an intermediate load track 12, 14, an alternative route for the wirebonds that connect them to the inner load track.

The arms extending from the inner load track pass beneath the AC terminals 6, 7, but without making electrical contact with them.

Figure 4:
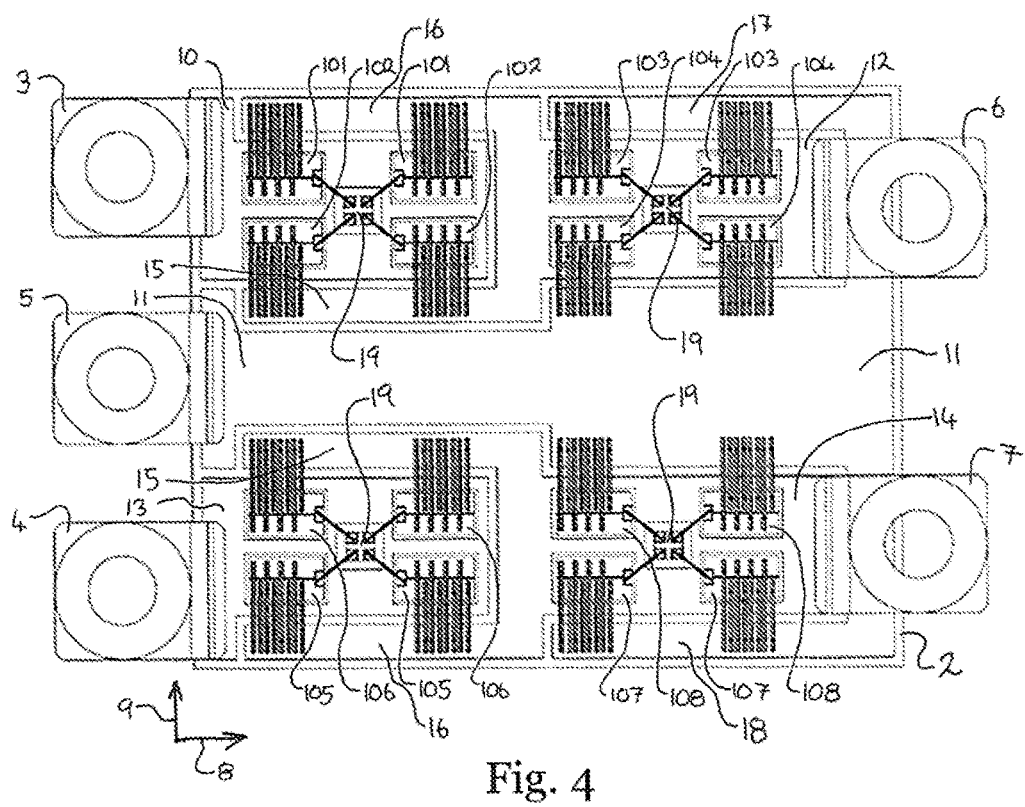
FIG. 4 shows a plan view of another embodiment of the substrate of the inventive power module 1.

FIG. 4 shows another embodiment of the substrate of the inventive power module 1. Here, the layout is topologically similar to that shown in FIG. 3. In this embodiment, gate contact pads 19 are positioned centrally within groups of semiconductor switches 101-102, 103-104, 105-106, 107-108 and the gate connections between the gate contact pad and the gate connections on the top surface of each of the semiconductor switches extend radially from the gate contact pad 19 to the semiconductor switches 101-108.

Figure 5:
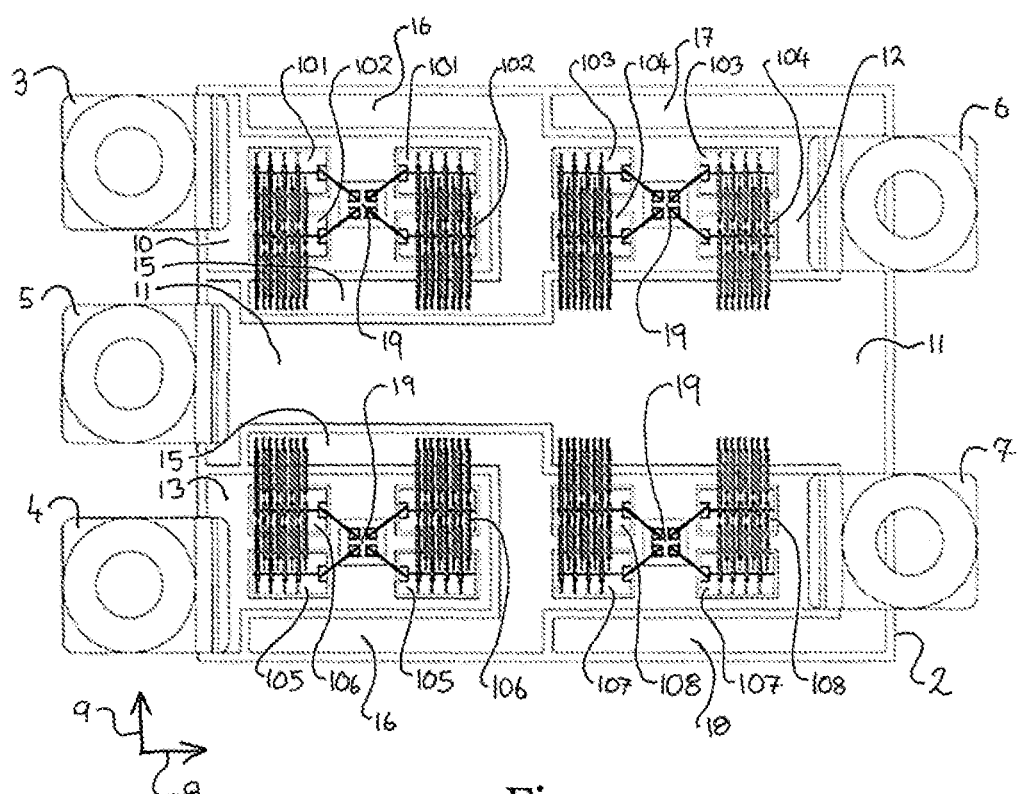
FIG. 5 shows a plan view of another embodiment of the substrate of the inventive power module 1.
Figure 6:
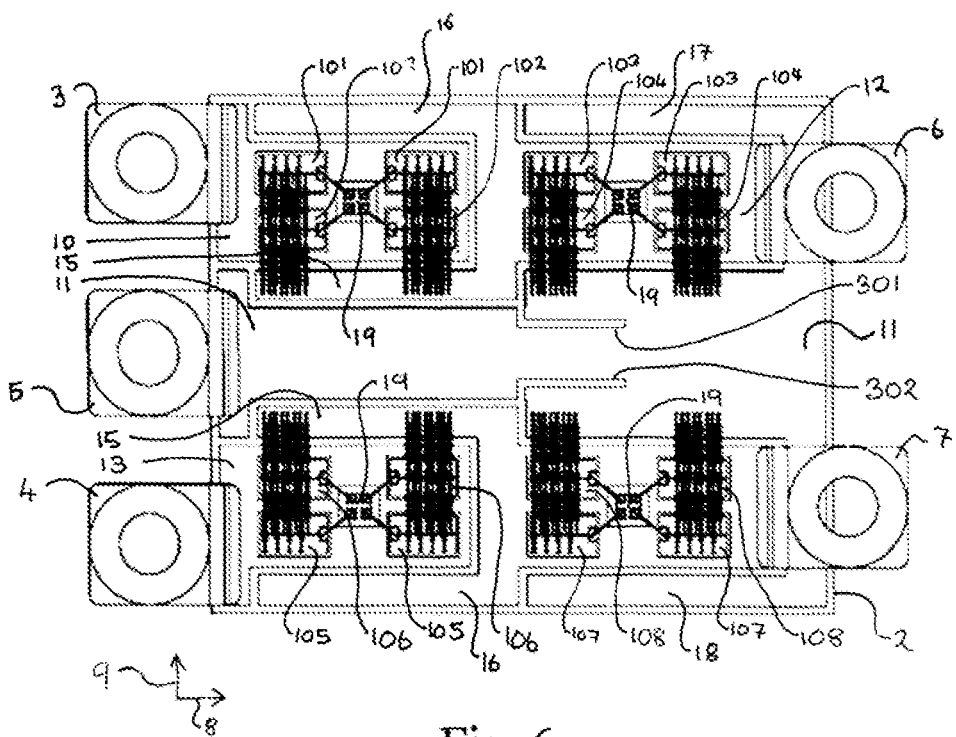
FIG. 6 shows an improvement of the layout illustrated in FIG. 5.

FIG. 5 illustrates another embodiment of the substrate of the inventive power module 1. Here the layout of the tracks are similar to that shown in FIG. 2. FIG. 6 shows an improvement of the layout illustrated in FIG. 5 where slots 301, 302 have been in load track 11 added for current shaping in order to balance the commutation paths of chips 107,108 and 104. Such current slots can be used to equalise current path length between the different chips.

Figure 7:
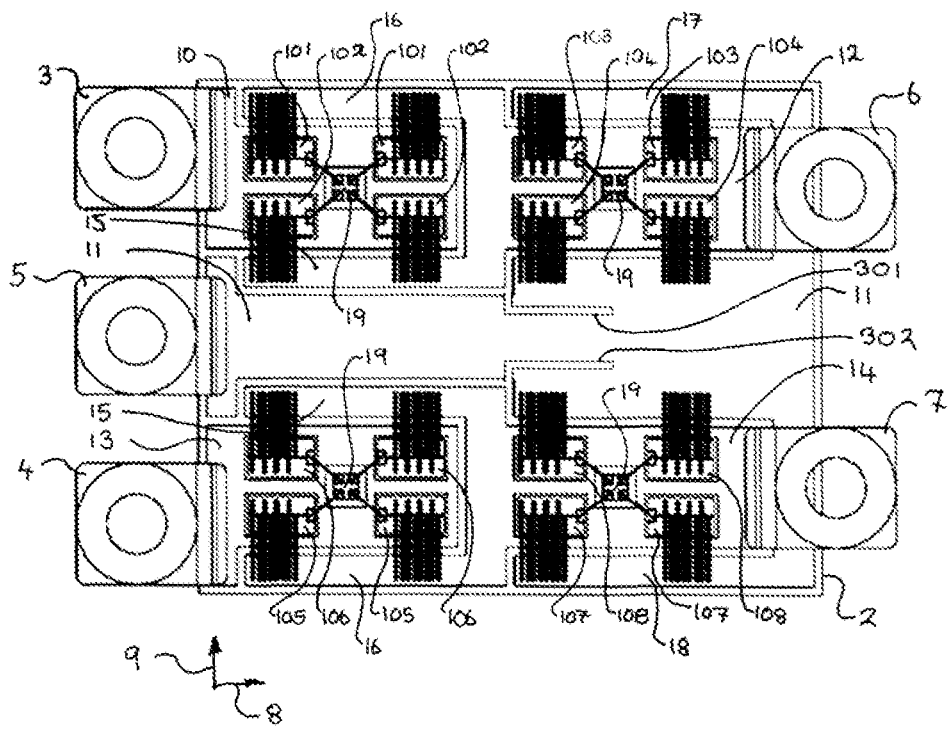
FIG. 7 shows an improvement of the layout illustrated in FIG. 4.

FIG. 7 shows a similar improvement of the layout illustrated in FIG. 4. As in FIG. 6, current-shaping slots 301, 302 have also been added in the load track 11.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A power module providing a half bridge, the power module comprising:
    at least one substrate comprising an inner load track, two intermediate load tracks and two outer load tracks,
    wherein the inner load track is elongated and extends substantially across the at least one substrate in a first direction;
    wherein a first external terminal is mounted on at least one of the intermediate load tracks at one end of the power module in the first direction;
    wherein a second external terminal is mounted on at least one of the outer load tracks and a third external terminal is mounted on the inner load track;
    wherein the second and third external terminals are mounted at the other end of the power module to the first external terminal mounted on at least one of the intermediate load tracks in the first direction;
    wherein semiconductor switches are mounted on the outer load tracks and are electrically connected to the intermediate load track;
    wherein semiconductor switches are mounted on the intermediate load tracks and are electrically connected to the inner load track;
    wherein a first intermediate load track of the two intermediate load tracks comprises a first elongated arm extending in the first direction between the outer load track and the inner load track with respect to a second direction at right angles to the first direction; and
    wherein at least one semiconductor switch is mounted on one of the outer load tracks and electrically connected to an elongated arm of one of the intermediate load tracks.

2. The power module according to claim 1, wherein the layout of the load tracks is symmetric about a line extending in the first direction.

3. The power module according to claim 2, wherein a gate contact pad is positioned centrally in a group of semiconductor switches and wherein gate connections extend radially from the gate contact pad to the semiconductor switches.

4. The power module according to claim 2, wherein one or more external gate contact terminal(s) is/are placed on the external surface of the power module, extending substantially orthogonally to the plane of the substrate.

5. The power module according to claim 1, wherein a gate contact pad is positioned centrally in a group of semiconductor switches and wherein gate connections extend radially from the gate contact pad to the semiconductor switches.

6. The power module according to claim 5, wherein one or more external gate contact terminal(s) is/are placed on the external surface of the power module, extending substantially orthogonally to the plane of the substrate.

7. The power module according to claim 1, wherein one or more external gate contact terminal(s) is/are placed on the external surface of the power module, extending substantially orthogonally to the plane of the substrate.

8. The power module according to claim 1, wherein at least one semiconductor switch is mounted on one of the intermediate load tracks and electrically connected to the inner load track through wirebonds.

9. The power module according to claim 8, wherein the wirebonds of the at least one semiconductor switch passes over another semiconductor switch mounted on the intermediate load track before contacting the inner load track.

10. The power module according to claim 1, wherein a second intermediate load track of the two intermediate load tracks comprises at least a first elongated arm extending in the first direction alongside at least the one of the outer load tracks and/or at least one of the outer load tracks comprises at least a first elongated arm extending in the first direction alongside at least the one of the intermediate load tracks.

11. The power module according to claim 1, wherein at least one of the intermediate load tracks and at least one of the outer load tracks are arranged side-by-side in the first direction.

12. A power module providing a half bridge, the power module comprising:
    at least one substrate comprising an inner load track, two intermediate load tracks and two outer load tracks,
    wherein the inner load track is elongated and extends substantially across the at least one substrate in a first direction;
    wherein a first external terminal is mounted on at least one of the intermediate load tracks at one end of the power module in the first direction;
    wherein a second external terminal is mounted on at least one of the outer load tracks and a third external terminal is mounted on the inner load track;
    wherein the second and third external terminals are mounted at the other end of the power module to the first external terminal mounted on at least one of the intermediate load tracks in the first direction;
    wherein two rows of semiconductor switches are mounted on the intermediate load tracks and are electrically connected to the inner load track through wirebonds; and
    wherein the wirebonds of one row of the two rows of semiconductor switches pass over the other row of the two rows of semiconductor switches before contacting the inner load track.

13. The power module according to claim 12, wherein semiconductor switches are mounted on the outer load tracks and are electrically connected to the intermediate load track.

14. The power module according to claim 12, wherein each intermediate load track comprises a first elongated arm extending in the first direction between the outer load track and the inner load track with respect to a second direction at right angles to the first direction.

15. The power module according to claim 12, wherein at least one semiconductor switch is mounted on an outer load track and electrically connected to an elongated arm of one of the intermediate load tracks.

16. The power module according to claim 12, wherein the layout of the load tracks is symmetric about a line extending in the first direction.

17. The power module according to claim 12, wherein a gate contact pad is positioned centrally in a group of semiconductor switches of the two rows of semiconductor switches, and wherein gate connections extend radially from the gate contact pad to the group of semiconductor switches.

18. The power module according to claim 12, wherein each row of the two rows of semiconductor switches lie on a respective plane extending in the first direction.

19. The power module according to claim 12, wherein at least one of the intermediate load tracks and at least one of the outer load tracks are arranged side-by-side in the first direction.

20. The power module according to claim 12, wherein at least one of the intermediate load tracks comprises at least a first elongated arm extending in the first direction alongside at least the one of the outer load tracks and/or at least one of the outer load tracks comprises at least a first elongated arm extending in the first direction alongside at least the one of the intermediate load tracks.

* * * * *